(12) United States Patent
Ahmed et al.

(10) Patent No.: US 11,482,644 B2
(45) Date of Patent: Oct. 25, 2022

(54) NANOWIRE LIGHT EMITTING DIODES WITH HIGH EXTRACTION EFFICIENCY FOR MICRO LED DISPLAYS

(71) Applicant: Intel Corporation, Santa Clara, CA (US)

(72) Inventors: Khaled Ahmed, Anaheim, CA (US); Sansaptak Dasgupta, Hillsboro, OR (US); Ivan-Christophe Robin, Grenoble (FR)

(73) Assignee: Intel Corporation, Santa Clara, CA (US)

( * ) Notice: Subject to any disclaimer, the term of this patent is extended or adjusted under 35 U.S.C. 154(b) by 880 days.

(21) Appl. No.: 16/147,748

(22) Filed: Sep. 29, 2018

(65) Prior Publication Data

US 2020/0105970 A1     Apr. 2, 2020

(51) Int. Cl.
| | |
|---|---|
| *H01L 33/24* | (2010.01) |
| *H01L 33/32* | (2010.01) |
| *H01L 33/00* | (2010.01) |
| *H01L 33/44* | (2010.01) |
| *H01L 33/22* | (2010.01) |
| *H01L 27/15* | (2006.01) |
| *H01L 33/60* | (2010.01) |
| *H01L 33/36* | (2010.01) |

(52) U.S. Cl.
CPC ............ *H01L 33/24* (2013.01); *H01L 27/156* (2013.01); *H01L 33/007* (2013.01); *H01L 33/0025* (2013.01); *H01L 33/22* (2013.01); *H01L 33/32* (2013.01); *H01L 33/44* (2013.01); *H01L 33/60* (2013.01); *H01L 33/36* (2013.01); *H01L 2933/0016* (2013.01); *H01L 2933/0025* (2013.01)

(58) Field of Classification Search
CPC .................................. H01L 33/24; H01L 33/22
See application file for complete search history.

(56) References Cited

U.S. PATENT DOCUMENTS

| 9,653,642 | B1* | 5/2017 | Raring | H01L 29/66462 |
|---|---|---|---|---|
| 2015/0280062 | A1* | 10/2015 | Yoo | H01L 33/0025 257/13 |
| 2018/0277523 | A1* | 9/2018 | Ahmed | H01L 25/0753 |
| 2019/0002719 | A1* | 1/2019 | Pousthomis | B01J 13/18 |

\* cited by examiner

*Primary Examiner* — Christopher A Johnson
(74) *Attorney, Agent, or Firm* — Schwabe, Williamson & Wyatt, P.C.

(57) ABSTRACT

Embodiments described herein comprise micro light emitting diodes (LEDs) and methods of forming such micro LEDs. In an embodiment, a nanowire LED comprises a nanowire core that includes GaN, an active layer shell around the nanowire core, where the active layer shell includes InGaN, a cladding layer shell around the active layer shell, where the cladding layer comprises p-type GaN, a conductive layer over the cladding layer, and a spacer surrounding the conductive layer. In an embodiment, a refractive index of the spacer is less than a refractive index of the cladding layer shell.

25 Claims, 9 Drawing Sheets

NANOWIRE LIGHT EMITTING DIODES WITH HIGH EXTRACTION EFFICIENCY FOR MICRO LED DISPLAYS

TECHNICAL FIELD

Embodiments of the disclosure are in the field of micro-LED displays.

BACKGROUND

Displays having micro-scale light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

DESCRIPTION OF THE EMBODIMENTS

A micro light-emitting diode (LED) display, its fabrication and assembly are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and methods for micro LED assembly. In an embodiment, a device and method for fabricating full-color micro light emitting diode (μLED) displays are described. Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to micro-LED displays with high light extraction efficiency.

The light extraction efficiency of a light emitting device made of semiconductor material is determined by the internal and external efficiencies thereof. Generally, the internal quantum efficiency relates to the characteristics of the material and the epitaxy quality of the device. The external quantum efficiency relates to the reflectivity of the material. The emission efficiency of a traditional nanowire LED is limited due to the incomplete emission of the light generated therefrom, which is due to the fact that semiconductor material has a higher refraction coefficient (e.g., n=2.2 to 3.8) than the air (n=1.0) or dielectric (e.g., $SiO_2$ or SiOC) surrounding the nanowire.

According to Snell's law, if the incident angle of light passing from a high refractive index medium to a low refractive index medium is larger than a critical angle, then the light undergoes total internal reflection such that it cannot enter the low refractive index medium. Most light emitted by a light emitting diode is subjected to the total internal reflection issue so as to decrease the overall emission efficiency of the light emitting diode.

One technique used in planar LEDs to minimize the total internal reflection loss is to form a structure having light scattering centers randomly distributed on the surface of a light emitting diode. Roughness or texture is formed on the surface of a planar light emitting diode by a chemical etch agent through a mask. However, the GaN group material used in nanowire LEDs is not easy to process because the GaN group material is highly rigid and has high resistance to effects of acidic and alkaline materials. General chemical agents and organic agents cannot etch the GaN group material. The most common method used for etching the GaN group material is the reactive ion etching (RIE) process. However, such a method may not be useful to create texture on the sidewalls of a nanowire LED. In addition, RIE will result in undesired damage to the p-type GaN layer.

Figure 1:
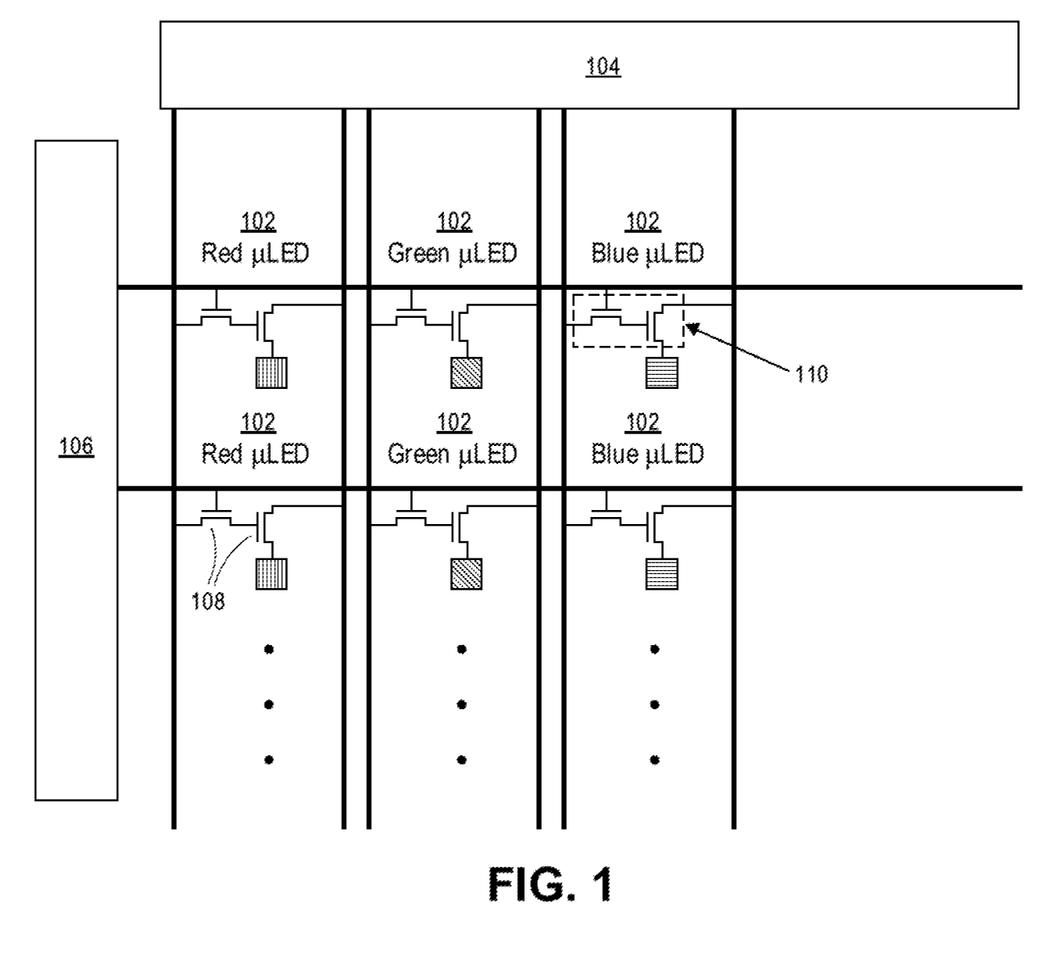
FIG. 1 is a schematic illustration of a display architecture, in accordance with an embodiment of the present disclosure.

Referring now to FIG. 1, a schematic illustration of a display architecture is shown, in accordance with an embodiment. Referring to FIG. 1, micro LEDs 102 are arranged in a matrix. While shown as generic blocks in FIG. 1, it is to be appreciated that the micro LEDs 102 may be any micro LED described in accordance with embodiments disclosed herein. For example, micro LEDs 102 may be any one of the nanowire LEDs with improved light extraction efficiency described in detail below with respect to FIGS. 3-7D). The micro LEDs are driven through "Data Driver" 104 and "Scan Driver" 106 chips. Thin film transistors 108 are used to make "pixel driver circuits" 110 for each micro LED. In an embodiment, the micro LEDs are fabricated on a silicon wafer then transferred to a glass substrate called "backplane" where the "pixel driver circuits" 110 have been fabricated using thin film transistors.

Figure 2:
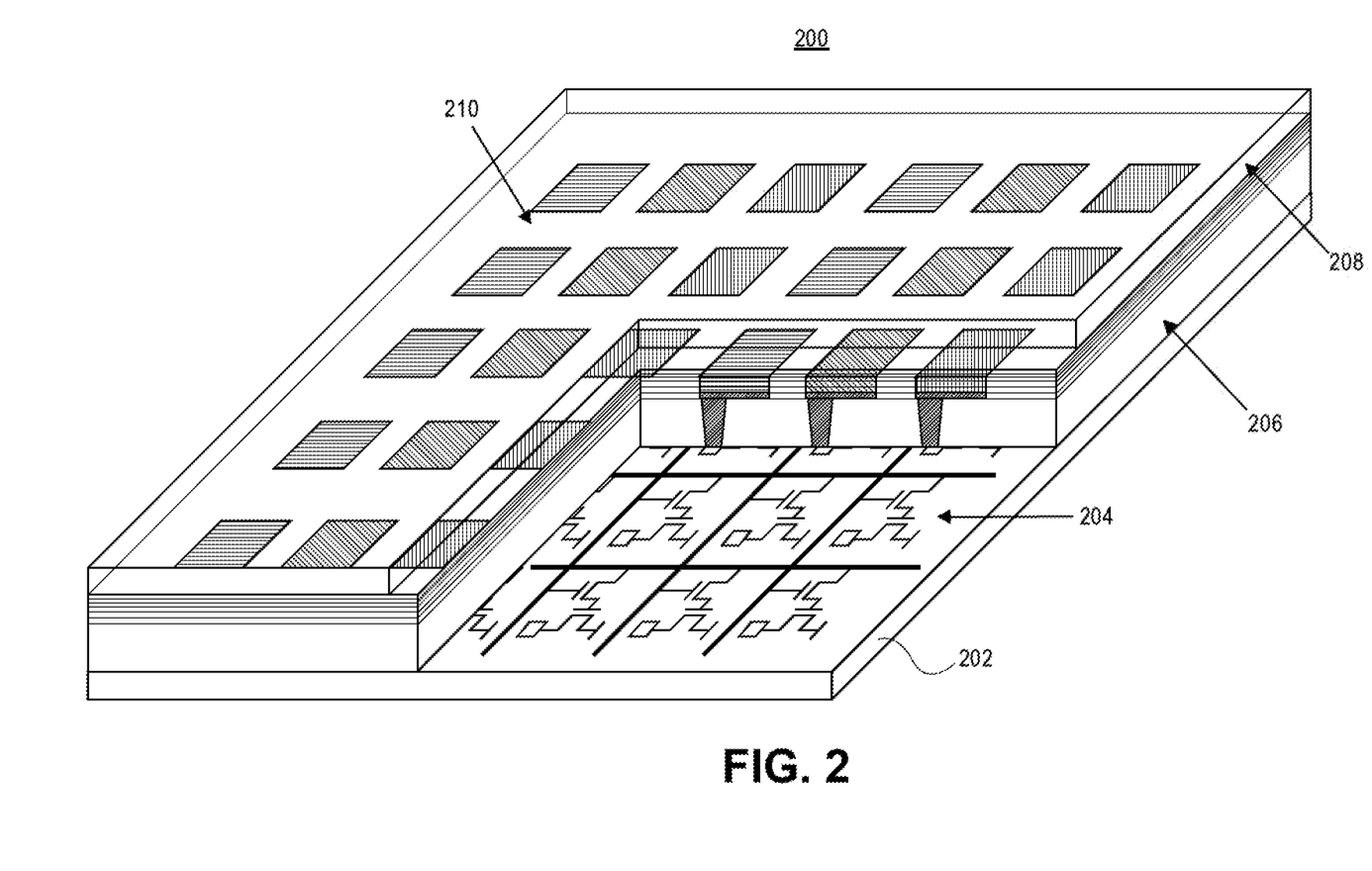
FIG. 2 is a schematic illustration of a micro-light emitting diode (LED) display architecture, in accordance with an embodiment of the present disclosure.

As an exemplary display architecture, FIG. 2 illustrates a schematic of micro LED display architecture, in accordance with an embodiment of the present disclosure. Referring to FIG. 2, a micro LED display 200 includes a backplane 202 having pixel circuits 204 thereon. An insulator 206 is over the pixel circuits 204. Micro LED layers 208 are included over the insulator 206. A transparent electrode 210 is over the micro LED layers 208.

Display architectures such as the display architectures illustrated in FIG. 1 and FIG. 2 may comprise micro LEDs (e.g., nanowire LEDs) with improved light extraction efficiency. In one embodiment, the light extraction efficiency of a nanowire LED may be improved by surrounding the nanowire LED with a spacer layer that has a refractive index that is lower than the refractive index of the semiconductor materials. In such an embodiment, total internal reflection is limited since the spacer serves as an index matching layer between the semiconductor materials and the external environment (e.g., dielectric layers or air).

Figure 3:
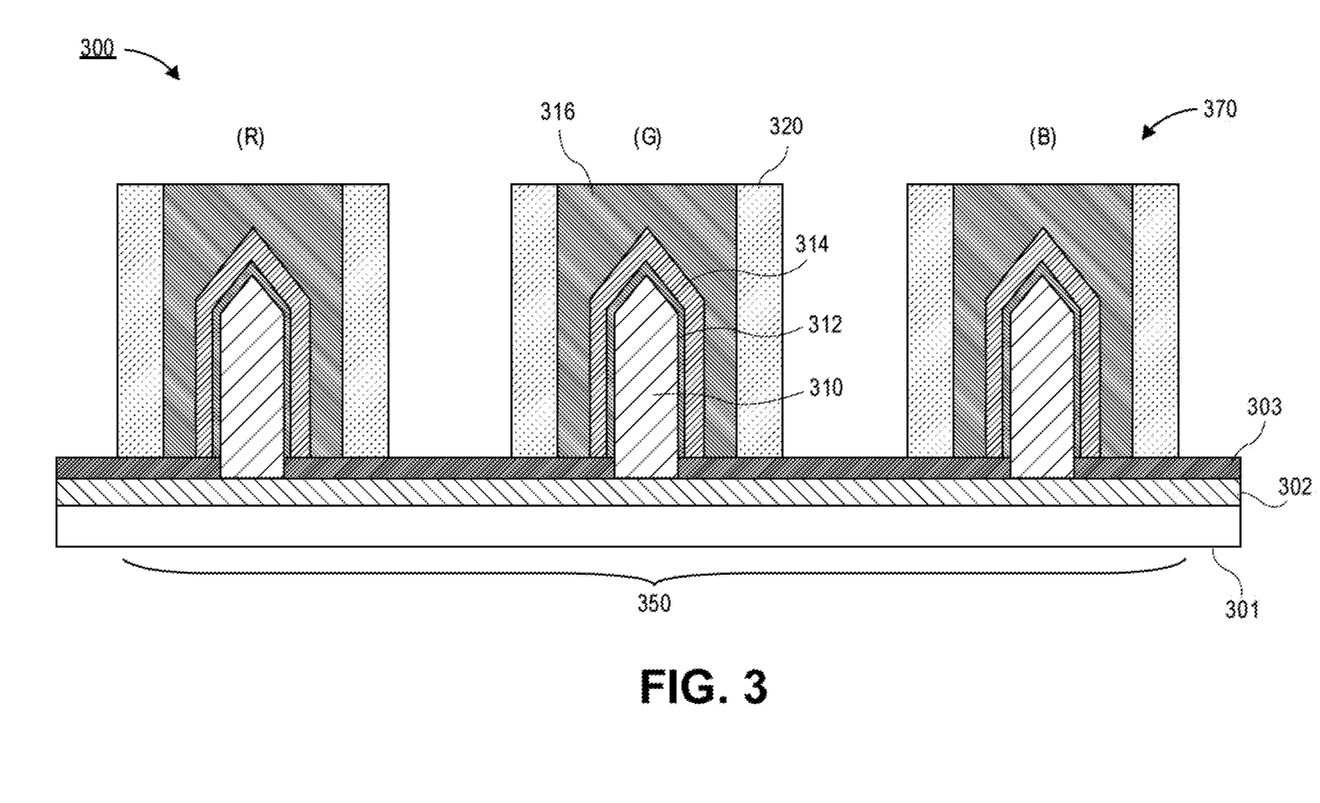
FIG. 3 is a cross-sectional illustration of a plurality of nanowire light emitting diodes (LEDs) that include spacers for reducing total internal reflections, in accordance with an embodiment.

FIG. 3 illustrates a cross-sectional view of a red green blue chip (an RGB chip) with three nanowire LEDs 370, in accordance with an embodiment of the present disclosure. Referring to FIG. 3, although shown as three different color nanowire LEDs 370 across (e.g., red, green, blue from left-right), the three are shown in this manner for illustrative purposes only. It is to be appreciated that for a pixel such as a 2×2 pixel element, only two nanowire LEDs 370 would be viewable for a given cross-section. It is to be appreciated that a variety of arrangements of nanowire LEDs 370 may be suitable to make a single pixel. In one embodiment, three nanowire LEDs 370 are arranged side-by-side, as depicted in FIG. 3. In another embodiment, four nanowire LEDs 370 are arranged a 2×2 arrangement. In another embodiment, nine nanowire LEDs 370 are arranged a 3×3 arrangement (three red nanowire LEDs 370, three green nanowire LEDs 370, and three blue nanowire LEDs 370), etc. It is to be appreciated that a micro LED is composed of an array of nanowire LEDs 370. The number of nanowire LEDs 370 per one micro LED is at least one. For example, a 10 μm×10 μm micro LED may be composed of 90 nanowire LEDs 370 connected in parallel to emit light of a specific color. It is further to be appreciated that, with respect to FIG. 3, the micro LEDs are represented by one nanowire LED 370 each for illustrative purposes. This in general is not the case. Typically, one micro LED will be composed of more than one nanowire LED 370. Also, in FIG. 3, one example arrangement is shown. That is, the three colors are adjacent to each other. However, in some cases, the micro LEDs of different colors are separated on the source wafer by a distance that may be half of the display pixel pitch, for example.

With reference again to FIG. 3, in a particular embodiment, a source micro LED wafer 301 (such as a silicon wafer) has "RGB Chips" monolithically grown thereon. A metal-based nucleation layer (MNL) 302 is disposed over the micro LED wafer 301. The MNL 302 may have a thickness in the range of 30-100 nm and may be crystalline or polycrystalline. In an embodiment, the MNL 302 may be a metal nitride, such as HfN, TiN, or the like. In some embodiments, a buffer layer (e.g., an aluminum nitride (AlN) buffer layer) (not shown) may be formed between the MNL 302 and the micro LED wafer 301. A mask 303 (e.g., a silicon nitride mask) is then deposited on the MNL 302. Lithography may then be used to open apertures in the silicon nitride mask 303 with diameters carefully chosen to accommodate the subsequent formation of LEDs that emit red, green, and blue colors. N-type GaN nanowire cores 310 are then grown, e.g., by metal organic chemical vapor deposition (MOCVD), as seeded from the MNL 302. The nanowire cores may have diameters in the range 50 nm to 250 nm.

Referring again to FIG. 3, indium gallium nitride (InGaN) shells 312 are grown around the N-type GaN nanowire cores 310, e.g., using MOCVD. The amount of indium in the InGaN shells 312 depends on the GaN core diameter. In an embodiment, smaller core diameter result in the growth of InGaN shells 312 with smaller indium content. Larger core diameters result in the growth of InGaN shells 312 with larger indium content. For blue (B) color emission, the indium content is approximately 20%. For green (G) color emission, the indium content is approximately 30%. For red (R) color emission, the indium content is approximately 40%. A P-type GaN cladding layer 314 may then be formed around the InGaN shells 312, e.g., using MOCVD. The exposed P-GaN cladding layer 314 for all color core-shell nanowire structures may then be covered with a transparent conductor (e.g., a transparent conductive oxide (TCO), such as indium tin oxide (ITO)) 316.

In an embodiment, a spacer 320 may surround the transparent conductor 316. The spacer 320 may be a material that has a refractive index that is less than the refractive index of the semiconductor materials of the nanowire LED. Providing an intermediate material with a refractive index between the refractive index of air (n=1) and the refractive index of the semiconductor materials (n=2.2 to 3.8) reduces the total internal reflections. Particularly, the spacer 320 increases the critical angle (from Snell's Law) and allows for more light to be emitted. In an embodiment, the spacer 320 may be titanium oxide (TiO$_2$), hafnium oxide (HfO$_2$), zirconium oxide (ZrO$_2$), doped TiO$_2$, doped HfO$_2$, doped ZrO$_2$, or any other material with a refractive index between the refractive index of air and the refractive index of the semiconductor materials.

Referring more generally to FIG. 3 a semiconductor structure 300 includes a silicon wafer 301 and plurality of pixel elements 350. Each of the pixel elements 350 includes a first color nanowire LED, a second color nanowire LED (the second color different than the first color), and a pair of third color nanowire LEDs (the third color different than the first and second colors). A spacer 320 is laterally surrounding each of the first color nanowire LED, the second color nanowire LED, and the pair of third color nanowire LEDs. It is to be appreciated that more than three colors may be fabricated. For example, structures may be fabricated for red, green, yellow or blue emission. In another example, structures may be fabricated for red, orange, green, or blue emission.

In an embodiment, for each of the pixel elements 350, the first color is red, the second color is green, and the third color is blue. In another embodiment, for each of the pixel elements 350, the first color is red, the second color is blue, and the third color is green. In another embodiment, for each of the pixel elements 350, the first color is blue, the second color is green, and the third color is red. In an embodiment, for each of the pixel elements 350, the first color nanowire LED, the second color nanowire LED, and the pair of third color nanowire LEDs have a 2×2 arrangement. In another embodiment, a structure referred to as "monolithic blue and green only" may be fabricated. In such a case, three times as many blue nanowire LEDs as the green nanowire LEDs are fabricated. Then, after transfer of the blue and green nanowire LEDs to the display backplane (at one shot of transfer), quantum dots are added on some of the blue nanowire LEDs to convert that blue to red color.

In an embodiment, upon fabrication of a nanowire LED source wafer 301, in order to fabricate a nanowire LED based display, a transfer method is used in which nanowire LEDs from the source wafer 301 are aligned to a target display backplane with the assistance of precise alignment, and released from the source wafer 301. In alternative embodiments, the direct transfer method may include bonding the nanowire LEDs from the source wafer 301 to the display backplane, and then releasing the nanowire LEDs from the source wafer 301.

In addition to the use of an intermediate refractive index material for the spacer 320, the spacer 320 may also have a structured surface that improves the light extraction efficiency. Examples of such spacers are shown in FIGS. 4A-6.

Figure 4A:
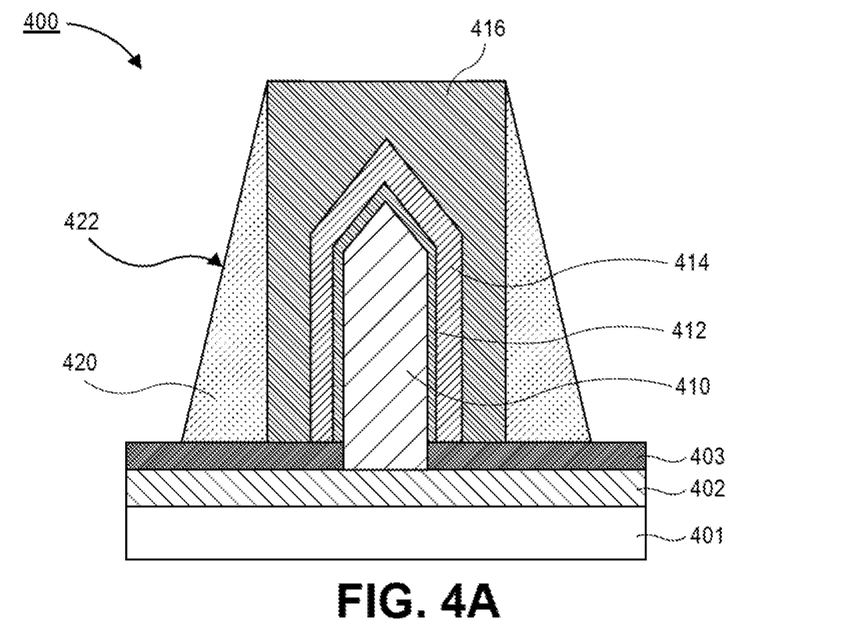
FIG. 4A is a cross-sectional illustration of a nanowire LED with a tapered spacer, in accordance with an embodiment.

Referring now to FIG. 4A, a cross-sectional illustration of a nanowire LED 400 is shown, in accordance with an embodiment. In an embodiment, the nanowire LED 400 may be formed on a source wafer 401 (e.g., a silicon wafer). In an embodiment, a N-type GaN nanowire core 410 may be epitaxially grown from the MNL 402 through a mask layer 403. An InGaN shell 412 and a P-GaN cladding layer 414 may be formed around the N-type GaN nanowire core 410. In an embodiment, a transparent conductor 416 may be formed around the cladding layer 414. In an embodiment, the nanowire LED 400 may be substantially similar to the nanowire LEDs described above with respect to FIG. 3, with the exception that the spacer 420 has a tapered surface 422. That is, the spacer 420 may have a base that is wider than a top region. Total internal reflection is reduced since the tapered surface reduces the incident angle of light emitted from sidewalls of the nanowire LED 400. In an embodiment, the spacer 420 may have a taper that is at an angle between approximately 70° and 90°. Such angles may be obtained with an etching process that includes a variable etch rate as a function of time.

Figure 4B:
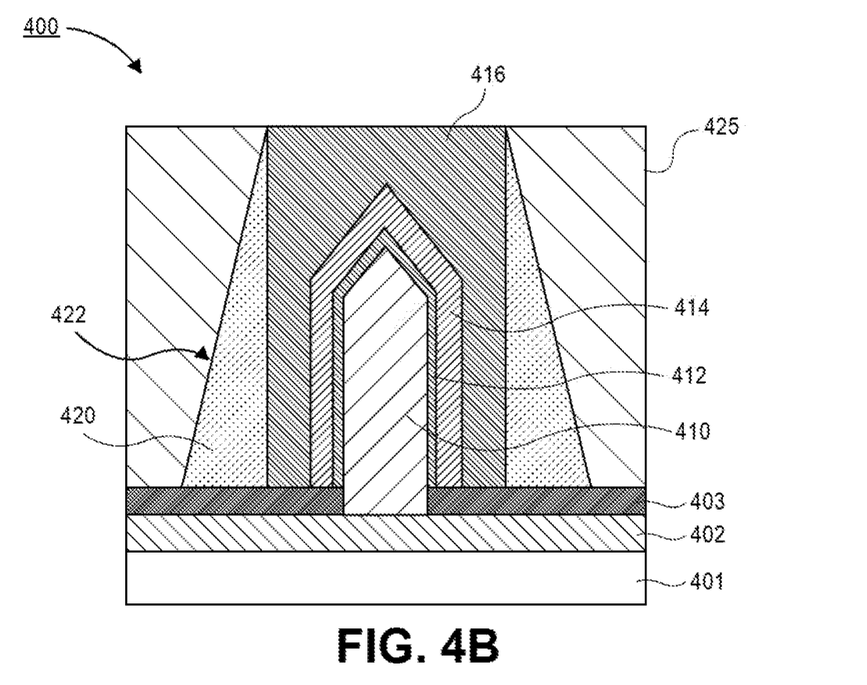
FIG. 4B is a cross-sectional illustration of a nanowire LED with a spacer and a dielectric layer, in accordance with an embodiment.

Referring now to FIG. 4B, a cross-sectional illustration of a nanowire LED 400 is shown, in accordance with an additional embodiment. In an embodiment, the nanowire LED 400 may be substantially similar to the nanowire LED described above with respect to FIG. 4A, with the exception that a second refractive index matching layer 425 is formed over the spacer 420. In an embodiment, the second refractive index matching layer 425 may have a refractive index that is less than the refractive index of the spacer 420 and greater than a refractive index of the surrounding environment (e.g., air or another dielectric layer).

In an embodiment, the second refractive index matching layer 425 may be a silicon oxide (e.g., SiO$_2$). In embodiments where the spacer 420 is a material other than TiO$_2$ (e.g., HfO$_2$ or ZnO$_2$), the second refractive index matching layer 425 may be TiO$_2$. The use of a second refractive index matching layer 425 provides a more gradual transition of the refractive index from the semiconductor material to the surrounding environment (e.g., air), and provides further improvement to the light extraction efficiency.

Figure 5A:
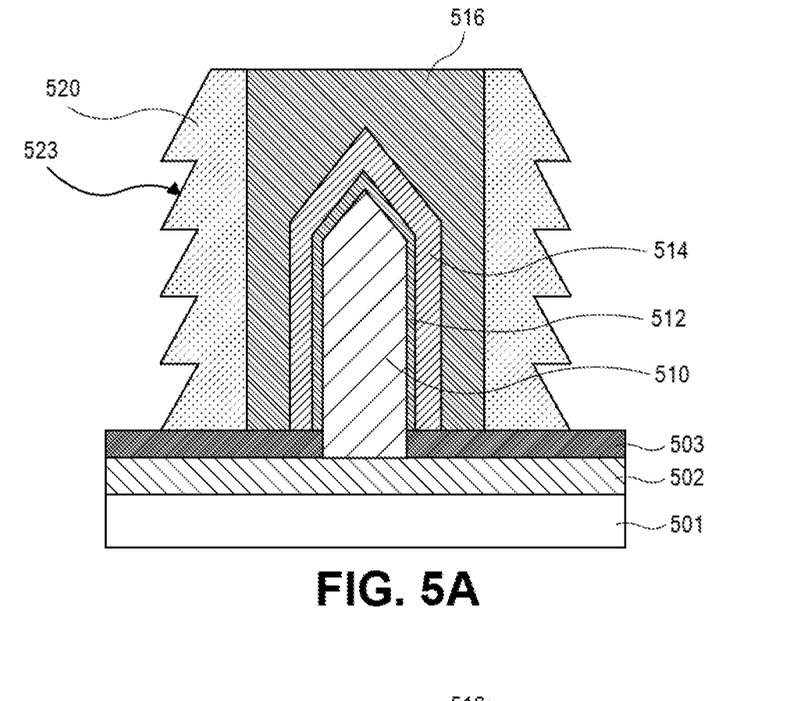
FIG. 5A is a cross-sectional illustration of a nanowire LED with a textured spacer, in accordance with an embodiment.

Referring now to FIG. 5A, a cross-sectional illustration of a nanowire LED 500 is shown, in accordance with an embodiment. In an embodiment, the nanowire LED 500 may be formed on a source wafer 501 (e.g., a silicon wafer). In an embodiment, a N-type GaN nanowire core 510 may be epitaxially grown from the MNL 502 through a mask layer 503. An InGaN shell 512 and a P-GaN cladding layer 514 may be formed around the N-type GaN nanowire core 510. In an embodiment, a transparent conductor 516 may be formed around the cladding layer 514. In an embodiment, the nanowire LED 500 is substantially similar to the nanowire LEDs described with respect to FIG. 3, with the exception that the spacer 520 includes a textured surface 523. In an embodiment, the textured surface 523 may comprise features that have a feature size that is smaller than the wavelength of the light emitted by the nanowire LED 500 (e.g., ⅕ to ¹/₁₀ the wavelength). For example, the feature size may be less than 400 nm. In a particular embodiment, the feature size may be between 30 nm and 400 nm. In some embodiments, the textured surface 523 may comprise randomly distributed features. In additional embodiments, the textured surface 523 may comprise features that are distributed in a periodic manner.

The inclusion of randomly distributed features in a textured surface 523 provides light scattering locations that allow for increased light extraction. In embodiments with periodic features in the textured surface 523, the features may be fabricated with facets that are at a controlled angle in order to provide desirable total internal reflections that preferentially direct light in a desired direction, as will be described in greater detail with respect to FIG. 6.

Figure 5B:
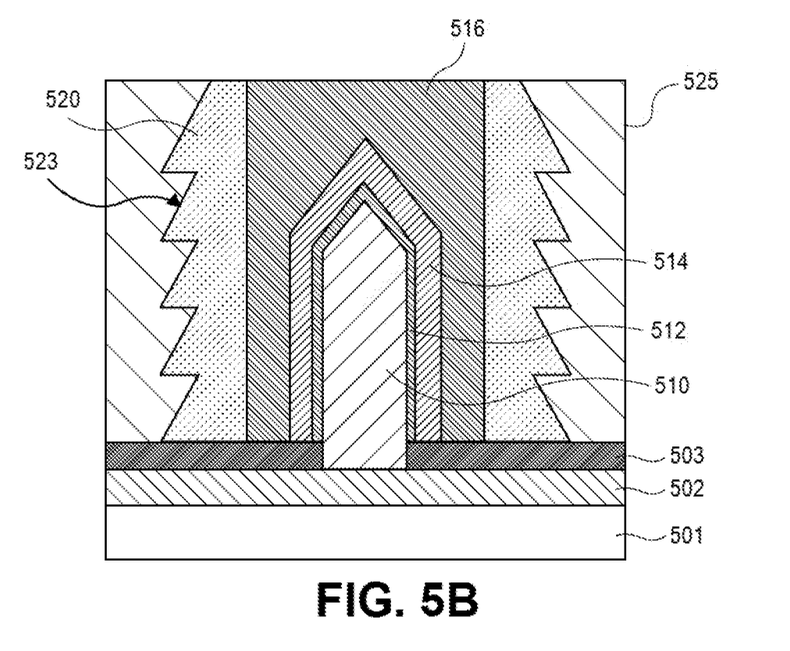
FIG. 5B is a cross-sectional illustration of a nanowire LED with a textured spacer and a dielectric layer surrounding the textured spacer, in accordance with an embodiment.

Referring now to FIG. 5B, a cross-sectional illustration of a nanowire LED 500 is shown, in accordance with an additional embodiment. In an embodiment, the nanowire LED 500 may be substantially similar to the nanowire LED described above with respect to FIG. 5A, with the exception that a second refractive index matching layer 525 is formed over the spacer 520. In an embodiment, the second refractive index matching layer 525 may have a refractive index that is less than the refractive index of the spacer 520 and greater than a refractive index of the surrounding environment (e.g., air or another dielectric layer).

In an embodiment, the second refractive index matching layer 525 may be a silicon oxide (e.g., $SiO_2$). In embodiments where the spacer 520 is a material other than $TiO_2$ (e.g., $HfO_2$ or $ZnO_2$), the second refractive index matching layer 525 may be $TiO_2$. The use of a second refractive index matching layer 525 provides a more gradual transition of the refractive index from the semiconductor material to the surrounding environment (e.g., air), and provides further improvement to the light extraction efficiency.

Figure 6:
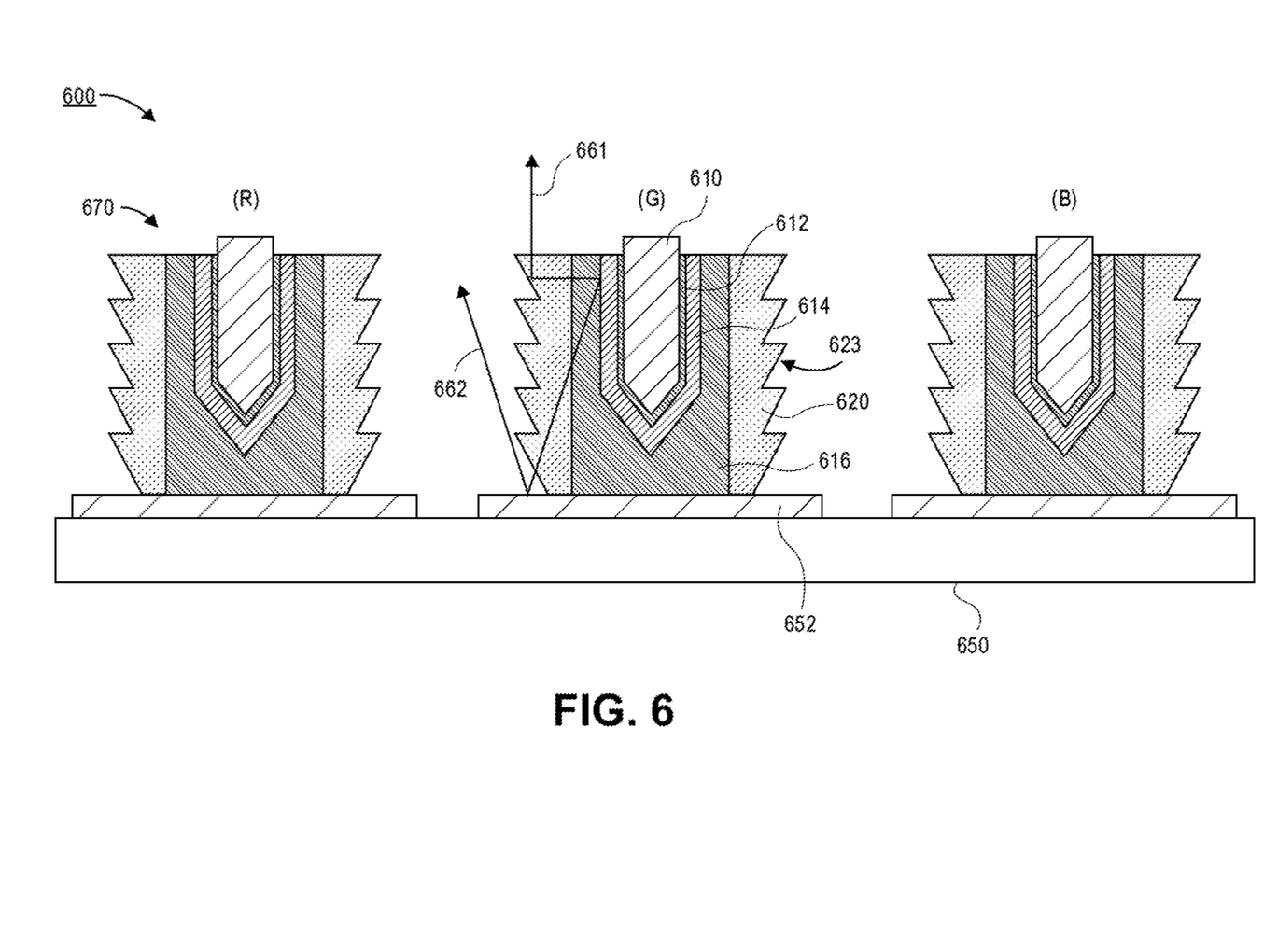
FIG. 6 is a cross-sectional illustration of a plurality of nanowire LEDs that are attached to a display backplane substrate, in accordance with an embodiment.

Referring now to FIG. 6, a cross-sectional illustration of a portion of a display backplane 600 is shown, in accordance with an embodiment. In the illustrated embodiment, a pixel comprising a red (R) nanowire LED 670, a green (G) nanowire LED 670, and a blue (B) nanowire LED 670 are shown. Referring to FIG. 6, although shown as three different color nanowire LEDs 670 across (e.g., red, green, blue from left-right), the three are shown in this manner for illustrative purposes only. It is to be appreciated that for a pixel such as a 2×2 pixel element, only two nanowire LEDs 670 would be viewable for a given cross-section. It is to be appreciated that a variety of arrangements of nanowire LEDs 670 may be suitable to make a single pixel. In one embodiment, three nanowire LEDs 670 are arranged side-by-side, as depicted in FIG. 6. In another embodiment, four nanowire LEDs 670 are arranged a 2×2 arrangement. In another embodiment, nine nanowire LEDs 670 are arranged a 3×3 arrangement (three red nanowire LEDs, three green nanowire LEDs, and three blue nanowire LEDs), etc.

In an embodiment, the nanowire LEDs 670 may be substantially similar to the nanowire LED 500 illustrated in FIG. 5A. For example, the nanowire LEDs 670 may include a N-type GaN nanowire core 610 that is surrounded by an active InGaN shell 612 and a cladding layer 614. A transparent conductor 616 may surround the cladding layer 614, and a spacer 620 may surround the transparent conductor 616.

In an embodiment, a plurality of nanowire LEDs 670 are mounted to the display backplane substrate 650. In a particular embodiment, the transparent conductor 616 of the nanowire LEDs 670 may be attached to conductive layers 652 over the display backplane substrate 650. In an embodiment, the conductive layers 652 may be electrically coupled to pixel circuits (not shown) as described above with respect to FIGS. 1 and 2. Embodiments may also include conductive layers 652 that are reflective (e.g., mirrors) that are wider than the nanowire LED 670 that is attached to the conductive layer 652. Accordingly, the conductive layers 652 may reflect some light 662 that is emitted from the nanowire LEDs 670 in order to improve light extraction efficiency.

In the illustrated embodiment, the nanowire LEDs 670 may comprise a spacer layer 620 with a textured surface 623. The textured surface 623 may have facets that are formed at an angle that promotes total internal reflection of light 661 that is emitted from the side of the nanowire LEDs 670. As shown, the light 661 may reflect off of a facet of the textured surface 623 and be directed away from the display backplane 650. Accordingly, light that would otherwise be lost out the side of the display is redirected towards a viewer.

In the illustrated embodiment, the nanowire LEDs 670 are shown with only a textured spacer 620, however, it is to be appreciated that embodiments may also include a second refractive index matching layer (similar to FIG. 5B described above).

In an additional aspect of embodiments disclosed herein, light extraction efficiency may be improved by forming nanowires with textured semiconductor materials. Instead of relying on a spacer layer to provide the textured layer for light scattering, additional embodiments include forming the textured surfaces (e.g., surfaces with features that have a dimension less than the wavelength of the light emitted by the nanowire LED) on the semiconductor materials themselves.

Figure 7A:
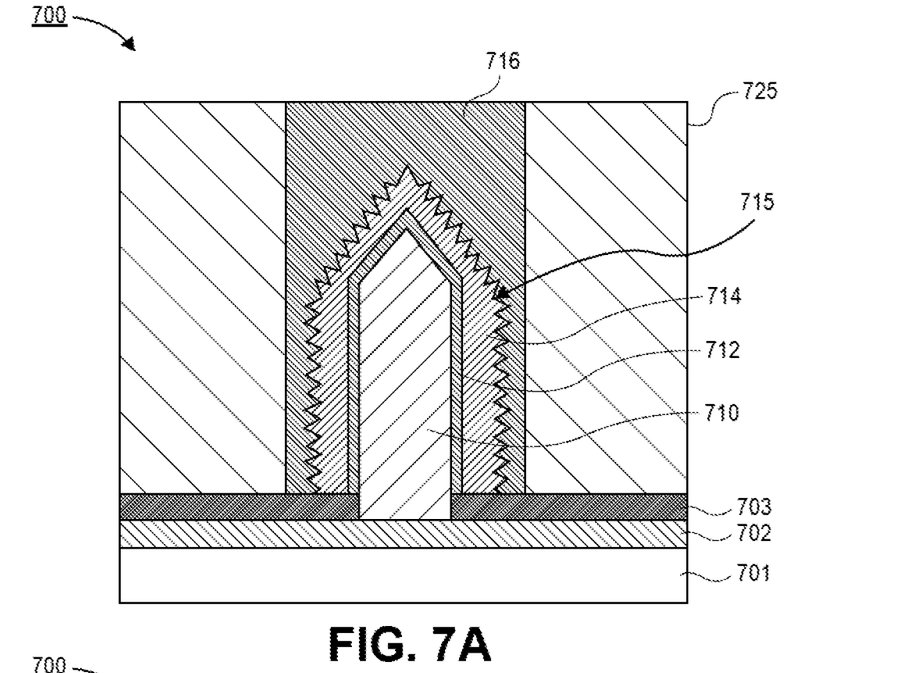
FIG. 7A is a cross-sectional illustration of a nanowire LED with a textured cladding layer, in accordance with an embodiment.

Referring now to FIG. 7A, a cross-sectional illustration of a nanowire LED 700 is shown, in accordance with an embodiment. In an embodiment, the nanowire LED 700 may be formed on a source wafer 701. For example, the source wafer 701 may be a silicon wafer. A MNL 702 may be formed over the source wafer 701, and a mask 703 (e.g., a silicon nitride mask) is formed over the MNL 702. In an embodiment, an N-type GaN nanowire core 710 is then grown, e.g., by MOCVD, as seeded from the MNL 702. The N-type GaN nanowire core 710 may have diameters in the range 50 nm to 250 nm. While a single N-type GaN nanowire core 710 is shown, it is to be appreciated that any number of N-type GaN nanowire core 710 may be grown on the source wafer 701, similar to described above with respect to FIG. 3.

In an embodiment, an indium gallium nitride (InGaN) shell 712 is grown around the N-type GaN nanowire core 710, e.g., using MOCVD. The amount of indium in the InGaN shell 712 depends on the GaN core diameter. In an embodiment, smaller core diameter result in the growth of InGaN shells with smaller indium content. Larger core diameters result in the growth of InGaN shells with larger indium content. For blue (B) color emission, the indium content is approximately 20%. For green (G) color emission, the indium content is approximately 30%. For red (R) color emission, the indium content is approximately 40%.

In an embodiment, a P-type GaN cladding layer 714 may then be formed around the InGaN shell 712, e.g., using MOCVD or organometallic vapor phase epitaxy (OMVPE). In an embodiment, the P-type GaN cladding layer 714 may comprise a textured surface 715. In an embodiment, the textured surface 715 may comprise features that have a feature size that is smaller than the wavelength of the light emitted by the nanowire LED 700 (e.g., ⅕ to ⅒ the wavelength). For example, the feature size may be less than 400 nm. In a particular embodiment, the feature size may be between 30 nm and 400 nm. In some embodiments, the textured surface 715 may comprise randomly distributed features. In additional embodiments, the textured surface 715 may comprise features that are distributed in a periodic manner.

In some embodiments, the textured surface 715 may be generated during the epitaxial growth of the P-type GaN cladding layer 714. For example, when an OMVPE process is employed, the growth process of GaN group materials in a hydrogen rich environment is significantly different from growth in a nitrogen environment. The V/III concentration ratio and concentrations of nitrogen and hydrogen in a carrier gas may be varied to control the roughness (i.e., texture) of the P-GaN epitaxial surface on the sidewalls of the nanowire. In an embodiment, a sufficiently high hydrogen content in the gas mixture carrying the nitrogen source may be obtained by using one or more of ammonia ($NH_3$), hydrazine ($N_2H_2$), and hydrogen ($H_2$). In some embodiments, the epitaxial growth may be implemented at low temperatures (e.g., less than 700° C.) in order to enhance the textured surface 715.

In an embodiment, the textured surface 715 may also be formed after the P-GaN cladding layer 714 is formed. In such an embodiment, the P-GaN cladding layer 714 may be exposed to a wet etchant chemistry (e.g., TMAH/$NH_4OH$, KOH) post growth. The highly doped P-GaN will allow for preferential etching along the 1122 planes, producing rough sidewalls.

In an embodiment, the exposed P-GaN cladding layer 714 for may then be covered with a transparent conductor (e.g., a transparent conductive oxide (TCO), such as indium tin oxide (ITO)) 716. In some embodiments, a dielectric layer 725 may also be formed around the transparent conductor 716.

Figure 7B:
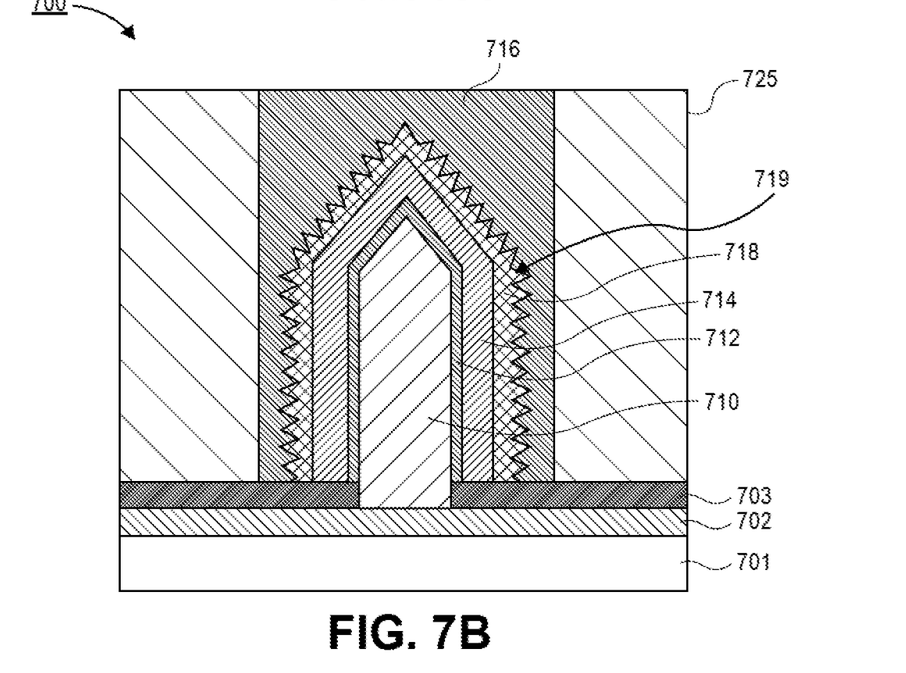
FIG. 7B is a cross-sectional illustration of a nanowire LED with a textured layer between the cladding layer and the conductive layer, in accordance with an embodiment.

Referring now to FIG. 7B, a cross-sectional illustration of a nanowire LED 700 is shown, in accordance with an additional embodiment. In an embodiment, the nanowire LED 700 may be substantially similar to the nanowire LED 700 described with respect to FIG. 7A, with the exception that the P-type GaN cladding layer 714 has a non-textured surface, and an InGaN shell 718 is formed between the P-type GaN cladding layer 714 and the transparent conductor 716. The InGaN shell 718 may comprise a textured surface 719. For example, the textured surface 719 may comprise features that are smaller than the wavelength of the light emitted by the nanowire LED 700 (e.g., ⅕ to ¹⁄₁₀ the wavelength). For example, the features of the textured surface 719 may have a dimension between 30 nm and 400 nm. In an embodiment, the textured surface 719 may comprise features that have a feature size that is smaller than the wavelength of the light emitted by the nanowire LED 700 (e.g., ⅕ to ¹⁄₁₀ the wavelength). For example, the feature size may be less than 400 nm. In a particular embodiment, the feature size may be between 30 nm and 400 nm. In some embodiments, the textured surface 719 may comprise randomly distributed features. In additional embodiments, the textured surface 719 may comprise features that are distributed in a periodic manner. In an embodiment, the InGaN may be a highly P-doped InGaN layer with an indium percentage less than approximately 15 (atomic) % Embodiments that include an InGaN textured surface allows for the light extraction efficiency to be increased without damaging the P-type GaN cladding layer 714.

Figure 7C:
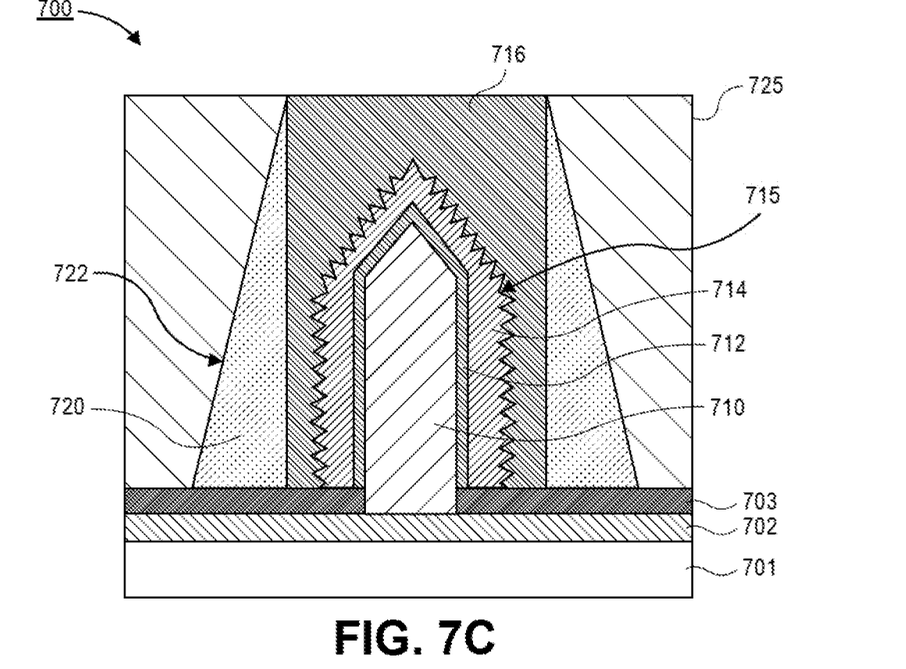
FIG. 7C is a cross-sectional illustration of a nanowire LED with a textured cladding layer and a spacer, in accordance with an embodiment.

Referring now to FIG. 7C, a cross-sectional illustration of a nanowire LED 700 is shown in accordance with an additional embodiment. In an embodiment, the nanowire 700 may be substantially similar to the nanowire 700 described with respect to FIG. 7A, with the exception that a spacer 720 is formed around the transparent conductor 716. In an embodiment, the spacer 720 may be substantially similar to any of the spacers described above with respect to FIGS. 3-6. In the illustrated embodiment, the spacer 720 is shown with a tapered surface 722. However, it is to be appreciated that other spacer configurations (e.g., non-tapered, faceted, etc.) may also be used in combination with a textured P-type GaN cladding layer 714.

Figure 7D:
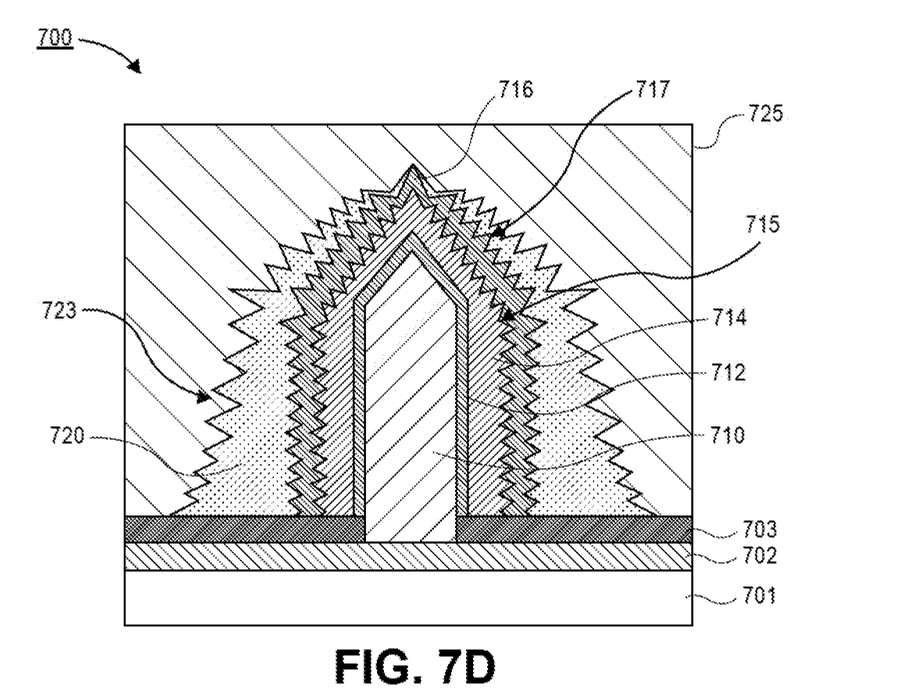
FIG. 7D is a cross-sectional illustration of a nanowire LED with a plurality of textured layers, in accordance with an embodiment.

Referring now to FIG. 7D, a cross-sectional illustration of a nanowire LED is shown, in accordance with another embodiment. As shown in FIG. 7D, a plurality of the layers surrounding the N-type GaN nanowire core 710 include textured surfaces. For example, the P-type GaN cladding layer 714 includes a textured surface 715, the transparent conductor 716 includes a textured surface 717, and the spacer 720 includes a textured surface 723.

In an embodiment, the innermost textured surface (i.e., textured surface 715 of the P-type GaN cladding layer 714) may be formed with a process such as described above with respect to FIG. 7A. The subsequently formed layers (i.e., the transparent conductor 716 and the spacer 720) may be formed with conformal processes. As such, the textured surfaces 717 and 723 may be obtained since the underlying layer (i.e., the P-type GaN cladding layer 714) has a textured surface.

Figure 8:
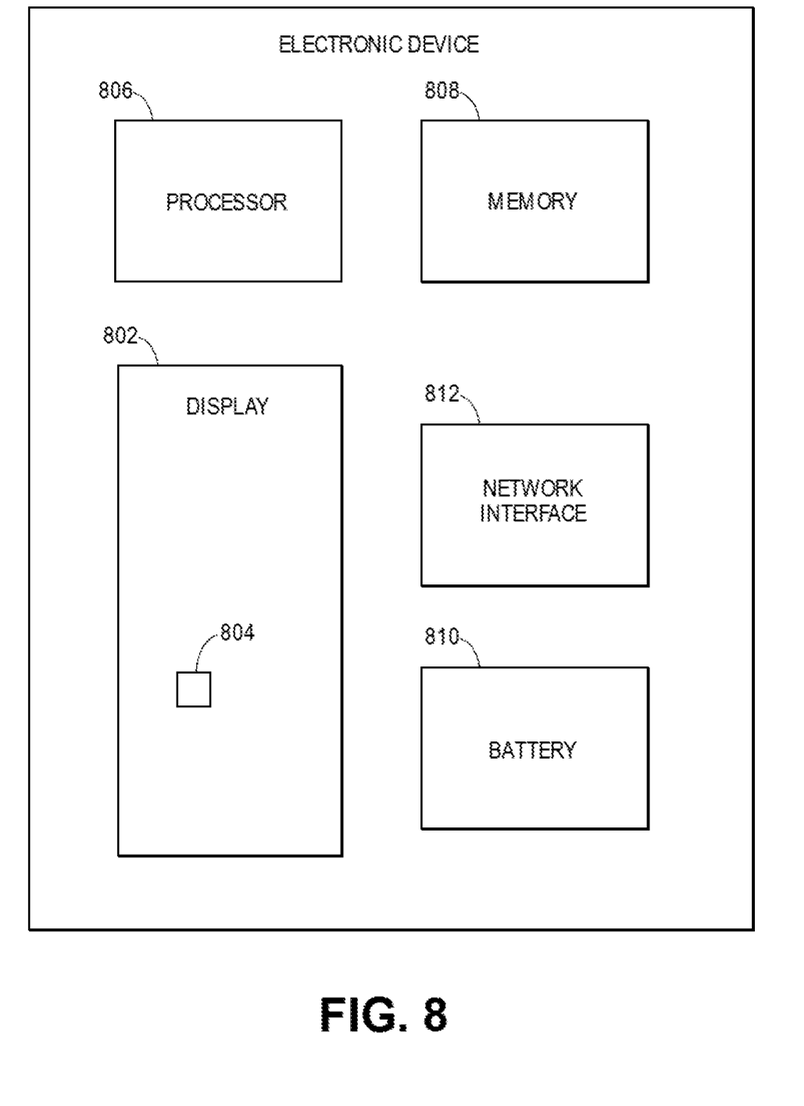
FIG. 8 is an electronic device having a display, in accordance with embodiments of the present disclosure.

FIG. 8 is an electronic device having a display, in accordance with embodiments of the present disclosure. Referring to FIG. 8, an electronic device 800 has a display or display panel 802 with a micro-structure 804. The display may also have glass layers and other layers, circuitry, and so forth. The display panel 802 may be a micro-LED display panel. As should be apparent, only one microstructure 804 is depicted for clarity, though a display panel 802 will have an array or arrays of microstructures including nanowire LEDs.

The electronic device 800 may be a mobile device such as smartphone, tablet, notebook, smartwatch, and so forth. The electronic device 800 may be a computing device, stand-alone display, television, display monitor, vehicle computer display, the like. Indeed, the electronic device 800 may generally be any electronic device having a display or display panel.

The electronic device 800 may include a processor 806 (e.g., a central processing unit or CPU) and memory 808. The memory 808 may include volatile memory and non-volatile memory. The processor 806 or other controller, along with executable code store in the memory 808, may provide for touchscreen control of the display and well as for other features and actions of the electronic device 800.

In addition, the electronic device 800 may include a battery 810 that powers the electronic device including the display panel 802. The device 800 may also include a network interface 812 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 800 may include additional components including circuitry and other components.

Thus, embodiments described herein include micro light-emitting diode (LED) fabrication and assembly.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a nanowire light emitting diode (LED), comprising: a nanowire core, wherein the nanowire core comprises GaN; an active layer shell around the nanowire core, wherein the active layer shell comprises InGaN; a cladding layer shell around the active layer shell, wherein the cladding layer comprises p-type GaN; a conductive layer over the cladding layer; and a spacer surrounding the conductive layer, wherein a refractive index of the spacer is less than a refractive index of the cladding layer shell.

Example 2: the nanowire LED of Example 1, wherein the spacer comprises a tapered sidewall.

Example 3: the nanowire LED of Example 1 or Example 2, wherein the spacer comprises $TiO_2$, $HfO_2$, $ZrO_2$, doped $TiO_2$, doped $HfO_2$, or doped $ZrO_2$.

Example 4: the nanowire LED of Examples 1-3, further comprising:
a dielectric layer around the spacer.

Example 5: the nanowire LED of Examples 1-4, wherein the refractive index of the spacer is greater than a refractive index of the dielectric layer.

Example 6: the nanowire LED of Examples 1-5, wherein the spacer comprises a textured surface.

Example 7: the nanowire LED of Examples 1-6, wherein the textured surface of the spacer comprises features that have a dimension that is between 30 nm and 400 nm.

Example 8: the nanowire LED of Examples 1-7, wherein the nanowire LED is attached to a display backplane substrate.

Example 9: the nanowire LED of Examples 1-8, wherein the display backplane substrate comprises a mirror below the nanowire LED.

Example 10: the nanowire LED of Examples 1-9, wherein the nanowire LED emits blue, red, or green light.

Example 11: a micro-LED display, comprising: a display backplane substrate; a plurality of micro-LEDs on the display backplane substrate, wherein the plurality of micro-LEDs each comprise: a nanowire core, wherein the nanowire core comprises GaN; an active layer shell around the nanowire core, wherein the active layer shell comprises InGaN; a cladding layer shell around the active layer shell, wherein the cladding layer comprises p-type GaN, and wherein the cladding layer shell comprises a textured surface; and a conductive layer shell over the cladding layer.

Example 12: the micro-LED display of Example 11, wherein the textured surface of the cladding layer shell comprises features with feature dimensions between 30 nm and 400 nm.

Example 13: the micro-LED display of Example 1 or Example 2, further comprising: a spacer surrounding the conductive layer shell.

Example 14: the micro-LED display of Examples 11-13, wherein the cladding layer shell, the conductive layer shell, and the spacer each comprise a textured surface.

Example 15: the micro-LED display of Examples 11-14, wherein a refractive index of the spacer is less than a refractive index of the cladding shell.

Example 16: the micro-LED display of Examples 11-15, wherein the spacer comprises $TiO_2$, $HfO_2$, $ZrO_2$, doped $TiO_2$, doped $HfO_2$, or doped $ZrO_2$.

Example 17: the micro-LED display of Examples 11-16, further comprising: a dielectric layer surrounding the spacer, wherein a refractive index of the dielectric layer is less than the refractive index of the spacer.

Example 18: the micro-LED display of Examples 11-17, wherein each of the plurality of nanowire LEDs are attached to a mirror on the display backplane substrate.

Example 19: a micro-LED display, comprising: a display backplane substrate; a plurality of micro-LEDs on the display backplane substrate, wherein the plurality of micro-LEDs each comprise: a nanowire core, wherein the nanowire core comprises GaN; an active layer shell around the nanowire core, wherein the active layer shell comprises InGaN; a cladding layer shell around the active layer shell, wherein the cladding layer comprises p-type GaN; a textured p-type InGaN layer around the cladding layer shell; and a conductive layer shell over the textured p-type InGaN layer.

Example 20: the micro-LED display of Example 19, wherein the textured p-type InGaN layer comprises features with feature dimensions between 30 nm and 400 nm.

Example 21: a method of forming a nanowire LED, comprising: forming a nanowire core over a silicon substrate; forming an active layer shell around the nanowire core; forming a cladding layer around the active layer shell, wherein the cladding layer comprises a textured surface; and forming a conductive layer around the cladding layer.

Example 22: the method of Example 21, wherein the textured surface of the cladding layer is formed during an epitaxial growth process used to form the cladding layer.

Example 23: the method of Example 21 or Example 22, wherein the epitaxial growth process comprises an organometallic vapor phase epitaxy (OMVPE) that comprises a source gas comprising nitrogen and gallium.

Example 24: the method of Examples 21-23, wherein the source gas comprises one or more of $NH_3$, $NH_2$, and $H_2$.

Example 25: the method of Examples 21-24, further comprising: forming an InGaN shell between the cladding layer and the conductive layer, wherein the InGaN shell comprises a textured surface.

What is claimed is:

1. A nanowire light emitting diode (LED), comprising:
   a nanowire core in an opening in a mask, wherein the nanowire core comprises GaN;
   an active layer shell around the nanowire core, wherein the active layer shell comprises InGaN;
   a cladding layer shell around the active layer shell, wherein the cladding layer comprises p-type GaN;
   a conductive layer over the cladding layer shell, the conductive layer in contact with the mask; and
   a spacer surrounding the conductive layer, wherein a refractive index of the spacer is less than a refractive index of the cladding layer shell.

2. The nanowire LED of claim 1, wherein the spacer comprises a tapered sidewall.

3. The nanowire LED of claim 1, wherein the spacer comprises $TiO_2$, $HfO_2$, $ZrO_2$, doped $TiO_2$, doped $HfO_2$, or doped $ZrO_2$.

4. The nanowire LED of claim 1, further comprising:
   a dielectric layer around the spacer.

5. The nanowire LED of claim 4, wherein the refractive index of the spacer is greater than a refractive index of the dielectric layer.

6. The nanowire LED of claim 1, wherein the spacer comprises a textured surface.

7. The nanowire LED of claim 6, wherein the textured surface of the spacer comprises features that have a dimension that is between 30 nm and 400 nm.

8. The nanowire LED of claim 6, wherein the nanowire LED is attached to a display backplane substrate.

9. The nanowire LED of claim 8, wherein the display backplane substrate comprises a mirror below the nanowire LED.

10. The nanowire LED of claim 1, wherein the nanowire LED emits blue, red, or green light.

11. A micro-LED display, comprising:
    a display backplane substrate;
    a plurality of micro-LEDs on the display backplane substrate, wherein the plurality of micro-LEDs each comprise:
        a nanowire core in an opening in a mask, wherein the nanowire core comprises GaN;
        an active layer shell around the nanowire core, wherein the active layer shell comprises InGaN;

a cladding layer shell around the active layer shell, wherein the cladding layer shell comprises p-type GaN, and wherein the cladding layer shell comprises a textured surface; and a conductive layer shell over the cladding layer, the conductive layer shell in contact with the mask.

12. The micro-LED display of claim 11, wherein the textured surface of the cladding layer shell comprises features with feature dimensions between 30 nm and 400 nm.

13. The micro-LED display of claim 11, further comprising:

a spacer surrounding the conductive layer shell.

14. The micro-LED display of claim 13, wherein the cladding layer shell, the conductive layer shell, and the spacer each comprise a textured surface.

15. The micro-LED display of claim 13, wherein a refractive index of the spacer is less than a refractive index of the cladding shell.

16. The micro-LED display of claim 15, wherein the spacer comprises $TiO_2$, $HfO_2$, $ZrO_2$, doped $TiO_2$, doped $HfO_2$, or doped $ZrO_2$.

17. The micro-LED display of claim 15, further comprising:

a dielectric layer surrounding the spacer, wherein a refractive index of the dielectric layer is less than the refractive index of the spacer.

18. The micro-LED display of claim 11, wherein each of the plurality of nanowire LEDs are attached to a mirror on the display backplane substrate.

19. A micro-LED display, comprising:

a display backplane substrate;

a plurality of micro-LEDs on the display backplane substrate, wherein the plurality of micro-LEDs each comprise:

a nanowire core in an opening in a mask, wherein the nanowire core comprises GaN;

an active layer shell around the nanowire core, wherein the active layer shell comprises InGaN;

a cladding layer shell around the active layer shell, wherein the cladding layer shell comprises p-type GaN;

a textured p-type InGaN layer around the cladding layer shell; and a conductive layer shell over the textured p-type InGaN layer, the conductive layer shell in contact with the mask.

20. The micro-LED display of claim 19, wherein the textured p-type InGaN layer comprises features with feature dimensions between 30 nm and 400 nm.

21. A nanowire light emitting diode (LED), comprising:

a nanowire core, wherein the nanowire core comprises GaN;

an active layer shell around the nanowire core, wherein the active layer shell comprises InGaN;

a cladding layer shell around the active layer shell, wherein the cladding layer comprises p-type GaN;

a conductive layer over the cladding layer shell; and a spacer surrounding the conductive layer, wherein a refractive index of the spacer is less than a refractive index of the cladding layer shell, wherein the spacer comprises a tapered sidewall.

22. A nanowire light emitting diode (LED), comprising:

a nanowire core, wherein the nanowire core comprises GaN;

an active layer shell around the nanowire core, wherein the active layer shell comprises InGaN;

a cladding layer shell around the active layer shell, wherein the cladding layer comprises p-type GaN;

a conductive layer over the cladding layer shell; and a spacer surrounding the conductive layer, wherein a refractive index of the spacer is less than a refractive index of the cladding layer shell, wherein the spacer comprises a textured surface.

23. The nanowire LED of claim 22, wherein the textured surface of the spacer comprises features that have a dimension that is between 30 nm and 400 nm.

24. The nanowire LED of claim 22, wherein the nanowire LED is attached to a display backplane substrate.

25. The nanowire LED of claim 24, wherein the display backplane substrate comprises a mirror below the nanowire LED.

* * * * *